United States Patent
Xiong et al.

(10) Patent No.: US 11,356,123 B2
(45) Date of Patent: Jun. 7, 2022

(54) MEMORY SYSTEM WITH LOW-COMPLEXITY DECODING AND METHOD OF OPERATING SUCH MEMORY SYSTEM

(71) Applicant: SK hynix Inc., Gyeonggi-do (KR)

(72) Inventors: Chenrong Xiong, San Jose, CA (US); Fan Zhang, San Jose, CA (US); Haobo Wang, San Jose, CA (US); Xuanxuan Lu, San Jose, CA (US); Meysam Asadi, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 59 days.

(21) Appl. No.: 16/510,318

(22) Filed: Jul. 12, 2019

(65) Prior Publication Data
US 2021/0013905 A1    Jan. 14, 2021

(51) Int. Cl.
*H03M 13/29* (2006.01)
*H03M 13/11* (2006.01)

(52) U.S. Cl.
CPC ... *H03M 13/2975* (2013.01); *H03M 13/1108* (2013.01); *H03M 13/1117* (2013.01); *H03M 13/1131* (2013.01)

(58) Field of Classification Search
None
See application file for complete search history.

(56) References Cited

U.S. PATENT DOCUMENTS

| | | |
|---|---|---|
| 7,590,914 B2 | 9/2009 | Kim et al. |
| 8,006,161 B2 | 8/2011 | Lestable et al. |
| 9,294,132 B1 * | 3/2016 | Peleato-Inarrea ............ H03M 13/3927 |
| 10,230,396 B1 * | 3/2019 | Micheloni ......... H03M 13/6583 |
| 2017/0310342 A1 * | 10/2017 | Yen ................... H03M 13/3715 |
| 2019/0097653 A1 | 3/2019 | Zhang et al. |

OTHER PUBLICATIONS

Li et al.,"Improved parallel weighted bit-flipping decoding algorithm for LDPC codes" , IET Communications, 2009, vol. 3, Issue 1, pp. 91-99 (Year: 2009).*
Miladinovic et al), "Improved bit flipping decoding of low density parity-check codes", IEEE Transactions on Information Theory, vol. 51, No. 4, Apr. 2005 (Year: 2005).*
Cui et al),"Studies on Practical Low Complexity Decoding of Low-Density Parity-Check Codes" , IEEE-2007 (Year: 2007).*

* cited by examiner

*Primary Examiner* — April Y Blair
*Assistant Examiner* — Matthew W Wahlin
(74) *Attorney, Agent, or Firm* — IP & T Group LLP

(57) ABSTRACT

Memory controllers, decoders and methods to selectively perform bit-flipping (BF) decoding and min-sum (MS) decoding on codewords of an irregular low-density parity-check (LDPC) code. Bit-flipping (BF) decoding is executed with respect to variable nodes having relatively high column weights. MS decoding is executed with respect to variable nodes having relatively low column weights. A column-weight threshold is used to group the variable nodes into the higher and lower column weight groups. The two decoding techniques exchange results during the overall decoding process.

16 Claims, 7 Drawing Sheets

MEMORY SYSTEM WITH LOW-COMPLEXITY DECODING AND METHOD OF OPERATING SUCH MEMORY SYSTEM

BACKGROUND

1. Field

Embodiments of the present disclosure relate to a memory system and components thereof capable of performing low-complexity decoding, particularly on irregular low-density parity-check (LDPC) codes, and method of operating such memory system.

2. Description of the Related Art

The computer environment paradigm has shifted to ubiquitous computing systems that can be used anytime and anywhere. As a result, the use of portable electronic devices, such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices used as memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller may include an embedded processor that executes functional components such as firmware. The SSD functional components are typically device specific, and in most cases, can be updated.

The two main types of flash memories are named after the NAND and NOR logic gates. The individual flash memory cells exhibit internal characteristics similar to those of their corresponding gates. The NAND-type flash memory may be written to and read from in blocks (or pages) which are generally much smaller than the entire memory space. The NOR-type flash allows a single machine word (byte) to be written to an erased location or read independently. The NAND-type flash memory operates primarily in memory cards, USB flash drives, solid-state drives (SSDs), and similar products, for general storage and transfer of data.

A flash memory, e.g., of the NAND-type, may apply any of various error correction codes to correct errors in data. One such error correction code is low-density parity-check code (LDPC), which is an advanced error code that is used to recover a relatively large number of errors in data. LDPC codes are a class of linear block codes, which are characterized by a parity-check matrix that contains only a few 1's compared to the number of 0's.

One type of LDPC codes is irregular LDPC codes, which have a non-uniform column-weight distribution. For example, column weights of an irregular LDPC code may be as small as 3 and as large as 20. Compared with a regular LDPC code, the advantage of an irregular LDPC code is better min-sum (MS) decoding performance.

A bit-flipping (BF) decoding algorithm is important for SSD applications, especially mobile and client SSD applications, because such applications have stringent requirements for power consumption. Usually in an SSD controller, both BF and MS decoders are used. A BF decoder can decode most received codewords with small numbers of errors to reduce the power consumption of an SSD controller, and a MS decoder can be used to decode received codewords with larger numbers of errors to provide good error correction performance. Generally, due to low column weights, a BF decoder performs worse on irregular LDPC codes, as compared to regular LDPC codes. Therefore, a BF decoder algorithm is not suitable for irregular LDPC codes.

In this context embodiments of the present invention arise.

SUMMARY

Embodiments of the present invention provide an improved decoder and associated decoding algorithm with different sub-algorithms, which exhibits better error correction performance than conventional BF decoders applied to irregular LDPC codes. Moreover, such new BF decoder still has lower complexity and lower power-consumption than an MS decoder.

An aspect of the present invention includes memory controllers. Such a memory controller comprises a storage; and a decoder operably coupled to the storage and configured to perform decoding on received codewords of a code representable by at least variable nodes. The decoder is further configured to execute bit-flipping (BF) decoding with respect to a first set of the variable nodes, each variable node in the first set having a column weight that is greater than or equal to a column-weight threshold, and execute min-sum (MS) decoding with respect to a second set of the variable nodes, each variable node in the second set having a column weight that is less than the column-weight threshold.

In another aspect, a decoder for decoding received codewords of a code representable by at least variable nodes is provided. The decoder comprises a bit-flipping (BF) decoding module configured to execute BF decoding with respect to a first set of the variable nodes, each variable node in the first set having a column weight that is greater than or equal to a column-weight threshold; and a min-sum (MS) decoding module configured to execute MS decoding with respect to a second set of the variable nodes, each variable node in the second set having a column weight that is less than the column-weight threshold.

Further aspects of the present invention include methods of decoding, which may be performed by memory controllers and components thereof such as decoders. In this regard, another aspect of the present invention, entails a method for decoding received codewords of a code representable by variable nodes and check nodes. The method comprises the steps of updating decisions of a first set of the variable nodes, using a bit-flipping (BF) algorithm, to obtain updated decisions of the variable nodes of the first set, each variable node in the first set; updating a syndrome vector for the codewords using the updated decisions of the variable nodes of the first set; updating messages between the check nodes and a second set of variable nodes, using a min-sum (MS) algorithm, to obtain updated decisions of the variable nodes of the second set; and updating the syndrome vector using the update decisions of the variable nodes of the first set. The first and second sets of variable nodes are mutually exclusive sets.

Additional aspects of the present invention will become apparent from the following description.

DETAILED DESCRIPTION

Figure 1:
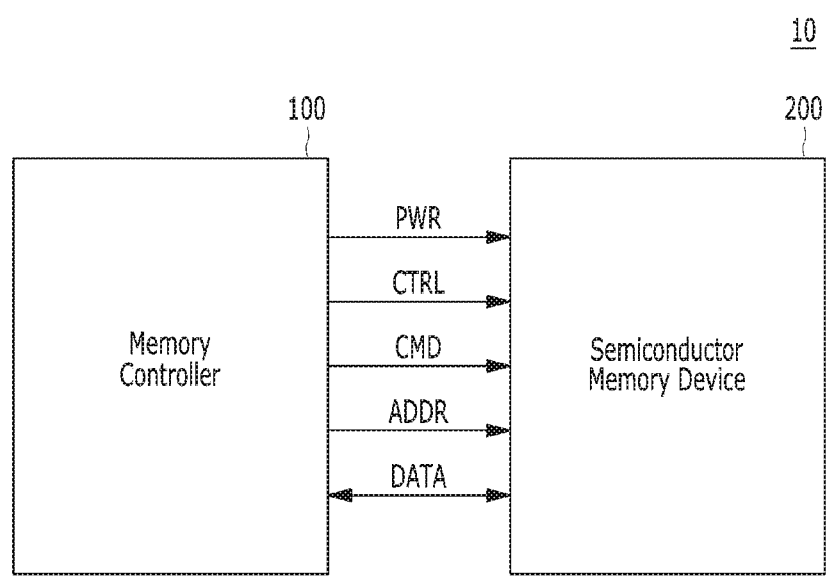
FIG. 1 is a block diagram illustrating a memory system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram schematically illustrating a memory system in accordance with an embodiment of the present invention.

Referring to FIG. 1, the memory system 10 may include a memory controller 100 and a semiconductor memory device 200, which may represent more than one such device. The semiconductor memory device(s) 200 may be flash memory device(s), particularly of the NAND-type. For brevity, semiconductor memory device 200 is sometimes simply referred to as memory device 200.

The memory controller 100 may control overall operations of the memory device 200.

The memory device 200 may perform one or more erase, program, and read operations under the control of the memory controller 100. The memory device 200 may receive a command CMD, an address ADDR and data DATA through input/output (I/O) lines. The memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the memory system 10 is used in an SSD, operation speed of a host (not shown) coupled to the memory system 10 may remarkably improve.

In another embodiment, the memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC) card, and/or a universal flash storage (UFS).

In still another embodiment, the memory system 10 may be provided as one of various components in an electronic device, such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
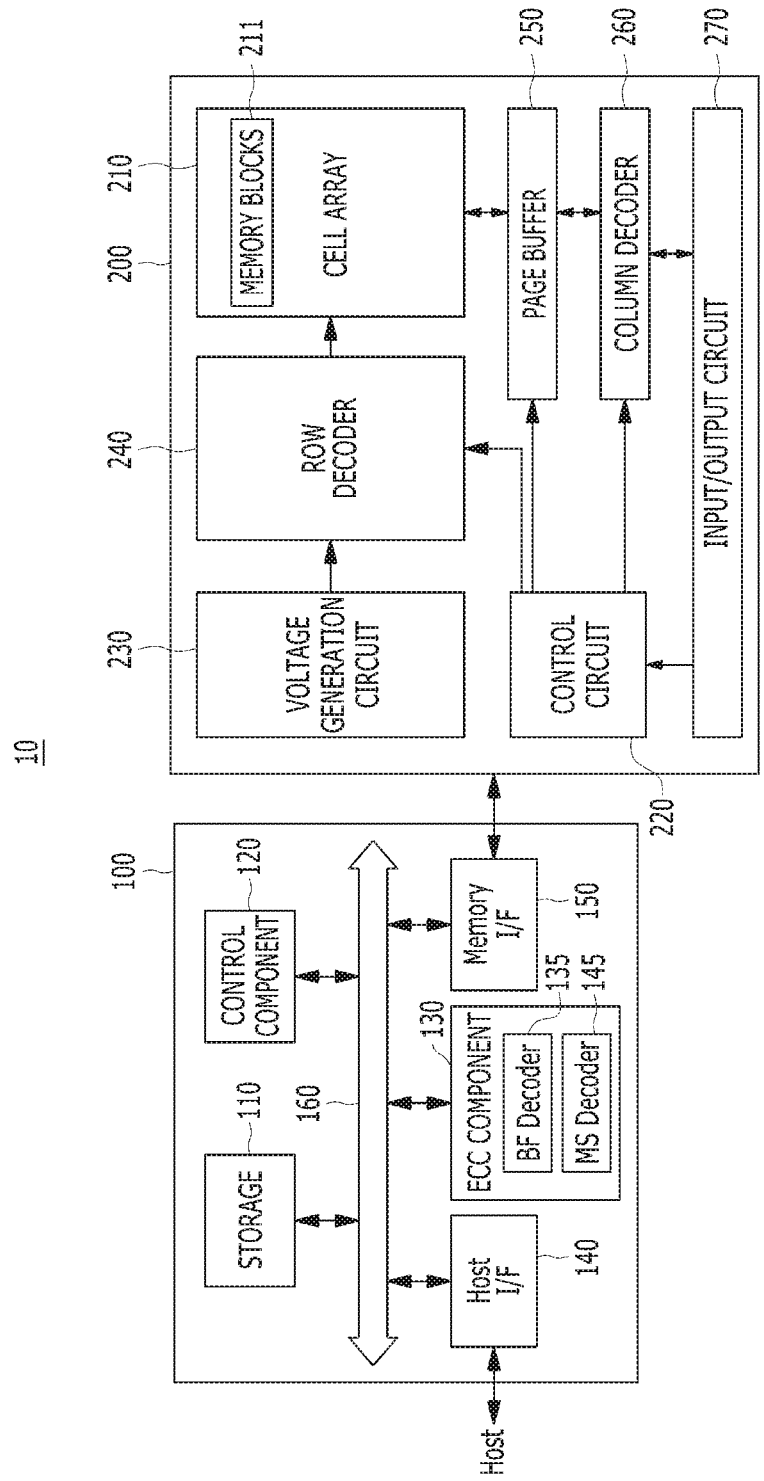
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device, such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device, such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device, such as a dynamic random access memory (DRAM) and/or a static random access memory (SRAM) or a non-volatile memory device, such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor, e.g., a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations, such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

The ECC component 130 may perform an error correction operation based on a coded modulation, such as a low-density parity-check (LDPC) code including irregular LDPC codes, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a block coded modulation (BCM).

Irregular LDPC codes are of particular relevance to embodiments of the present invention. Thus, the ECC component 130 may include any and all circuits, systems or devices for suitable error correction operation, including detecting and correcting errors in irregular LDPC codes in accordance with embodiments of the present invention. To that end, in embodiments of the present invention, the ECC component 130 includes a BF decoder 135 and an MS decoder 145, or the functionality of each embodied in a single decoder. As explained in more detail below, such single decoder is configured to execute a decoding scheme with BF and MS sub-algorithms on irregular LDPC codes.

The host interface 140 may communicate with the host device through one or more of various interface protocols, such as a universal serial bus (USB), a multi-media card (MMC), a peripheral component interconnect express (PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component or CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer (array) 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
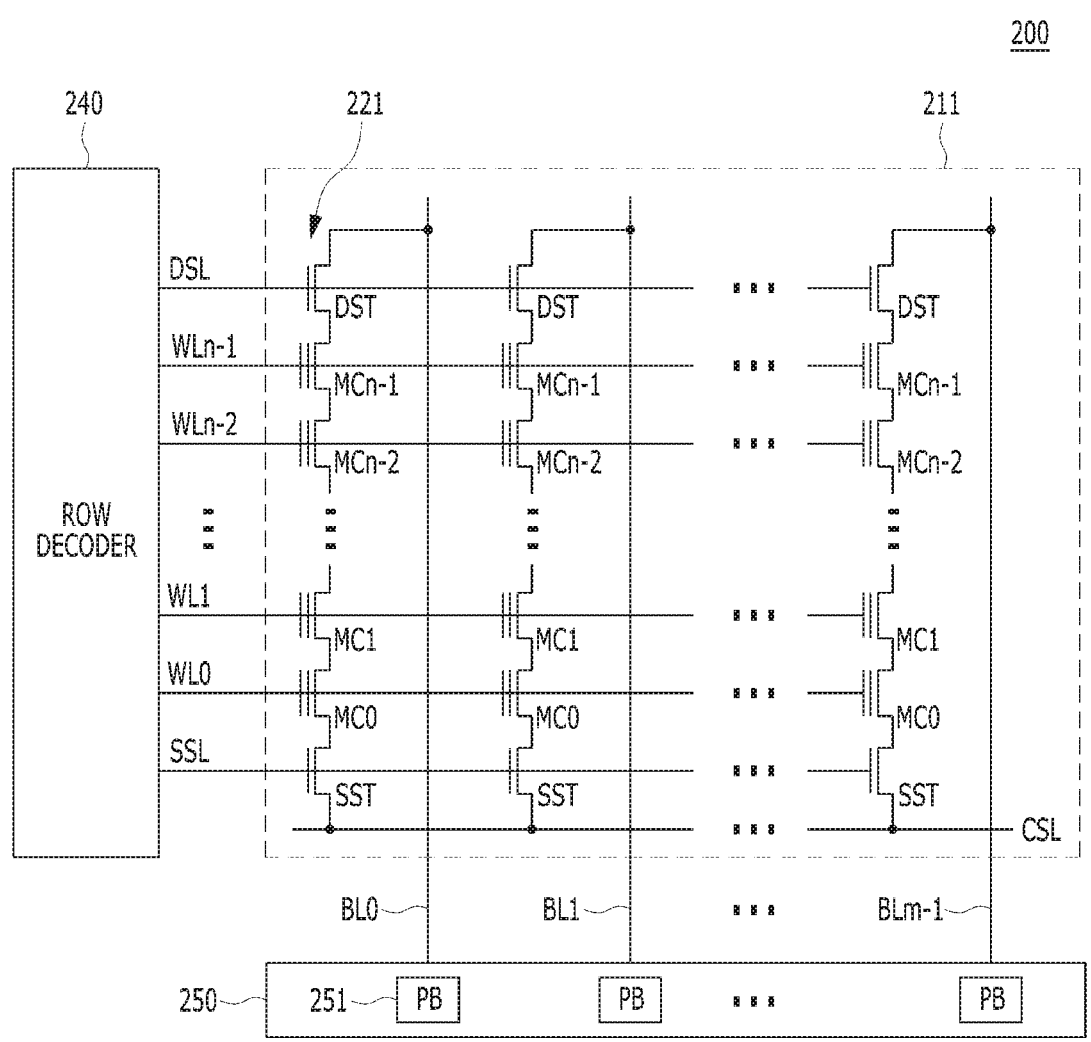
FIG. 3 is a circuit diagram illustrating a memory block of a memory device of a memory system in accordance with an embodiment of the present invention.

The page buffer (array) 250 may be in electrical communication with the memory cell array 210 through bit lines BL (shown in FIG. 3). The page buffer (array) 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer (array) 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

As previously noted, the page buffer 250 may be in the form of a page buffer array including a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
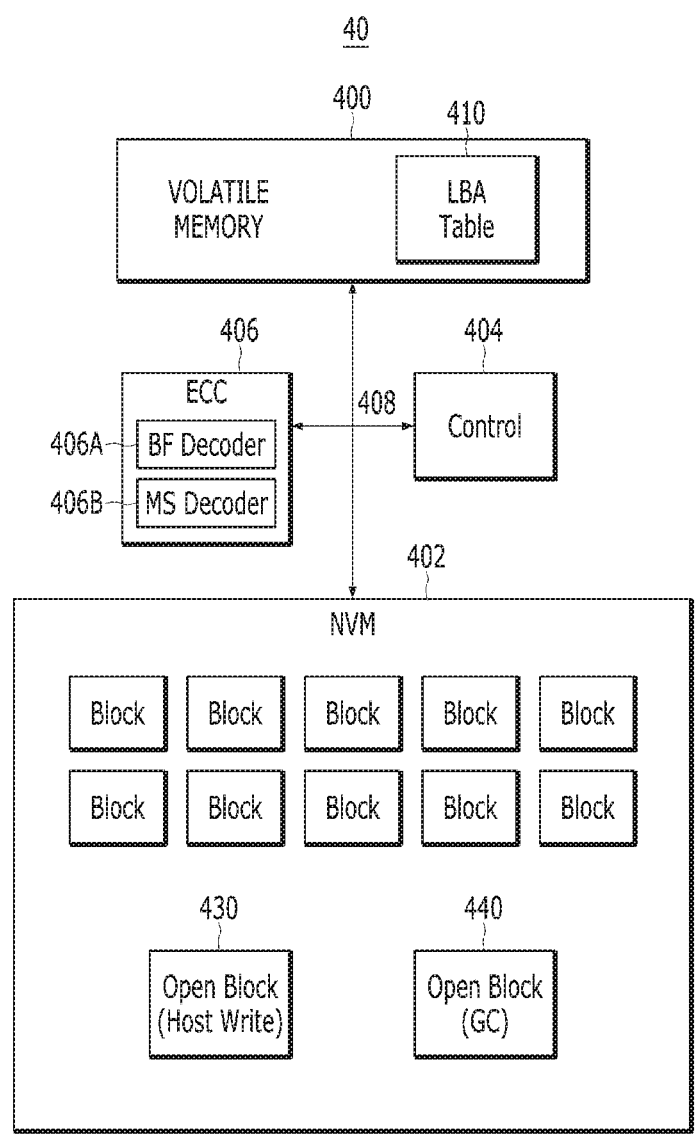
FIG. 4 is a schematic diagram of a memory system in accordance with an embodiment of the present invention.

Referring to FIG. 4, a general example of a memory system 40 is schematically illustrated. The memory system 40 may include a volatile memory 400 (e.g., a DRAM), a non-volatile memory (NVM) 402 (e.g., NAND), a control component or control logic 404, such as described herein, an error correcting code (ECC) module 406, such as described herein, and a bus 408 through which these components of the memory system 40 communicate. The volatile memory 400 may include a logical bit address (LBA) table 410 for mapping physical-to-logical addresses of bits. The NVM 402 may include a plurality of memory blocks, as well as an open block for host writes 430 and an open block for garbage collection (GC) 440. Multiple memory blocks may be grouped together as a super block for certain functional purposes.

The ECC module 406 may include a BF decoder 406A and an MS decoder 406B, which may correspond to the BF decoder 135 and MS decoder 145 respectively in FIG. 2. The ECC module 406 including its BF and MS decoders 406A, 406B may be used to carry out aspects of the present invention. In another embodiment, the ECC module 406 may include the functionalities of these types of decoders embodied or integrated as a single unit. Additional/alternative components that may be utilized with memory systems to effectuate the present invention will be understood to those of skill in the art in light of this disclosure.

As previously noted, embodiments of the present invention provide a new decoder and associated decoding scheme with sub-algorithms for BF and MS decoding that provides better correction performance than a conventional BF decoder applied to irregular LDPC codes, while at the same time having lower complexity and lower power-consumption than a typical MS decoder.

Given an irregular LDPC code, its variable nodes are divided or grouped into two sets based on their column weights. One set (SL) includes variable nodes, each of which has a low column weight. Other variable nodes, each with a high column weight, belong to the other set (SH). A column-weight threshold separates the two sets of variable nodes. In an embodiment, the column-weight threshold is 4, in which case the SH set includes each of the variable nodes having a column-weight greater than or equal to 4 and the SL set includes each of the variable nodes having a column weight less than 4. Other suitable column-weight thresholds may be used, which may be determined taking into account system constraints and desired performance criteria.

A BF decoding algorithm is used for variable nodes in SH, and for variable nodes in SL, an MS algorithm is used. In the decoding process, these two algorithms exchange decoding results until the received codewords are corrected or a maximum number of iterations is reached.

Figure 5:
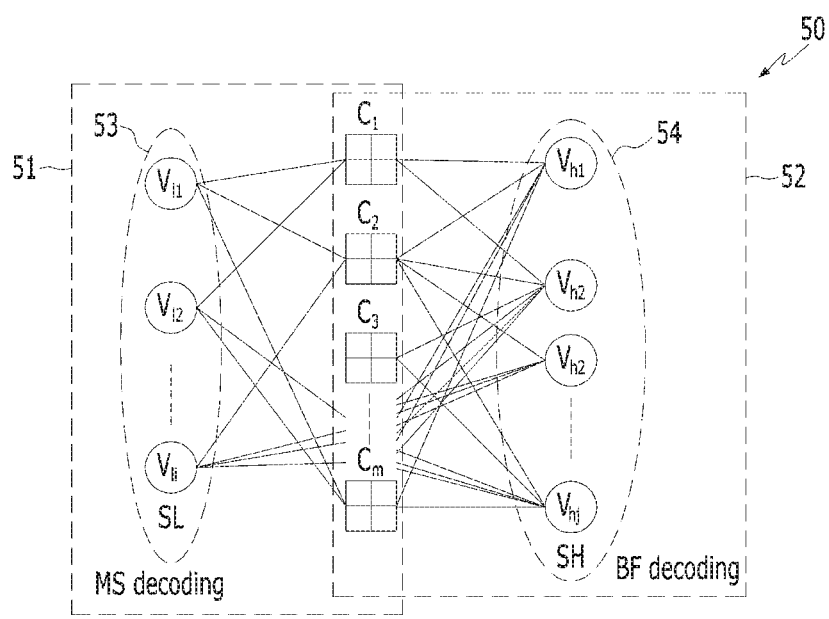
FIG. 5 illustrates a Tanner graph representation of a decoding scheme in accordance with an embodiment of the present invention.

FIG. 5 illustrates an embodiment of the decoding algorithm and its rules in the context of a Tanner graph 50 of an irregular LDPC code. Referring to FIG. 5, the Tanner graph 50 shows the min-sum (MS) decoding aspect 51 and the bit-flipping (BF) decoding aspect 52. The MS decoding aspect 51 includes an SL set of i variable nodes 53, and the BF decoding aspect 52 includes an SH set of j variable nodes 54, where i+j=n, which is the total number of variable nodes. The irregular LDPC code has m check nodes $C_1$, $C_2$, $C_3$, . . . , $C_m$, which are common to both MS and BF decoding.

A column-weight threshold is denoted as T-CW. The SH set 54 includes all variable nodes, each of which has a column weight that is no less than (or greater than or equal to) T-CW, and the SL set 53 includes all other variable nodes, i.e., all variable nodes, each of which has a column weight less than T-CW. As noted above, T-CW may be 4.

A decoder having the functionalities of the BF decoder 135/406A and MS decoder 145/406B may be used to carry out a decoding scheme or algorithm in accordance with embodiments of the present invention. That is, such decoder is configured to execute both a BF algorithm and an MS algorithm. A flow chart 60 of exemplary processing is shown in FIG. 6.

Figure 6:
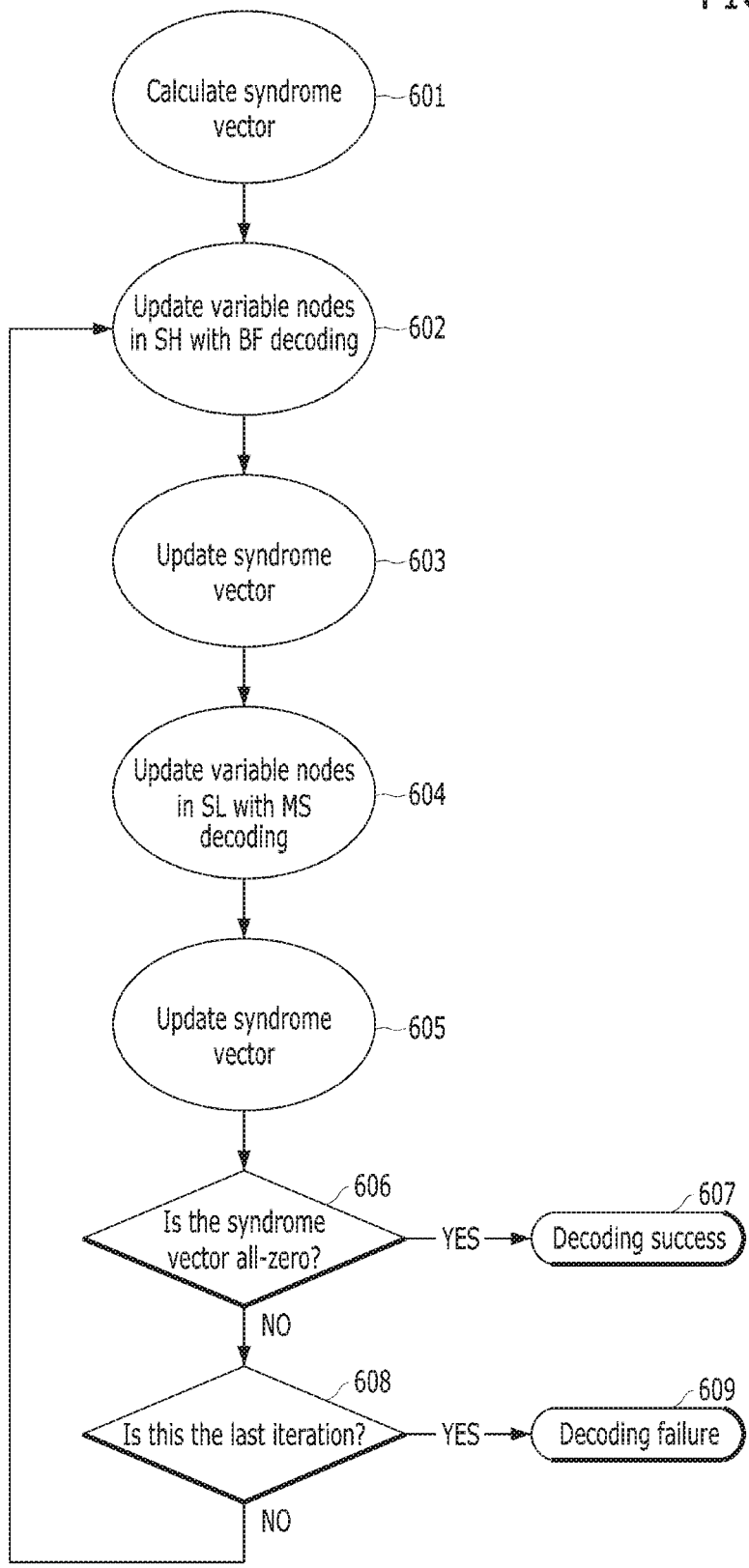
FIG. 6 is a flow chart illustrating a decoding scheme in accordance with an embodiment of the present invention.

Referring to the flow chart 60 of FIG. 6, with secondary reference to other figures, at step 601, the syndrome vector is calculated. At step 602, the BF algorithm updates decisions of the variable nodes in the SH set 54. The syndrome vector is then updated at step 603, using the new hard decisions of the variable nodes in the SH set 54 from step 602. An MS algorithm is employed at step 604 to update messages between the check nodes and the variable nodes in the SL set 53 and to obtain the updated hard decisions for such variable nodes. Using the new hard decisions of the variable nodes in the SL set 53, the syndrome vector is updated at step 605.

It is then determined at step 606 whether or not all syndrome bits are zero. If yes, the decoding was successful (step 607), in which case the hard decision for all variables is returned. If no at step 606, the process continues to step 608, where it is determined whether or not the current iteration number equals or has reached the maximum iteration number. If yes, the decoding is declared to be a failure. If the maximum iterations has not yet been reached (No at step 608), the process returns to step 602 and repeats from there.

Figure 7:
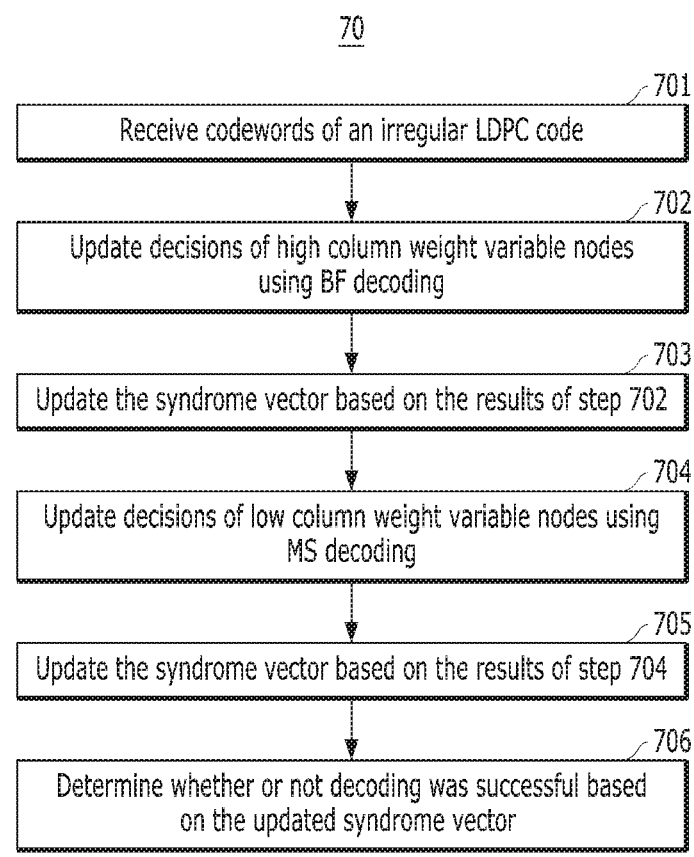
FIG. 7 is a flow chart illustrating steps in processes for decoding irregular codes in accordance with embodiments of the present invention.

FIG. 7 is a flow chart describing steps in processes for decoding received codewords of a code representable by variable nodes and check nodes, e.g., an irregular LDPC code, in accordance with embodiments of the present invention. The steps shown in flow chart 70 are exemplary. Those skilled in the art will understand that additional and/or alternative steps may be performed, or that the order of steps may be changed, to effectuate aspects of the present invention without departing from the inventive concepts disclosed herein. FIG. 7 is described with reference to other figures, particularly FIGS. 2, 4 and 5.

As previously described, in various embodiments, a variable nodes are grouped into a high column weight group and a low column weight group based on their respective column weights. Such grouping or categorizing may be done at any suitable time before decoding begins.

Referring to FIG. 7, at step 701, the ECC component 130, 406 or decoder with BF and MS decoding capability receives codewords encoded with an irregular LDPC code. At step 702, decoding decisions of high column weight variable nodes are updated using BF decoding. Then, at step 703, the syndrome vector is updated based on the results of step 702. Decoding decisions of low column weight variable nodes are updated using MS decoding at step 704. Then, at step 705, the syndrome vector is updated again, this time based on the results of step 704. The syndrome vector is then evaluated at step 706 to determine whether or not decoding was successful.

As the foregoing demonstrates, embodiments of the present invention provide improved decoding of LDPC codes, particularly irregular LDPC codes, by selectively employing BF decoding and MS decoding with respect to variable nodes depending on their column weights. The decoding scheme improves performance of memory systems, such as flash-based and enterprise SSDs.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A memory controller, comprising:
a storage; and
a decoder operably coupled to the storage and configured to perform decoding on received codewords of an irregular code having non-uniform column-weight distribution and representable by at least variable nodes;
wherein the decoder is further configured to:
execute bit-flipping (BF) decoding with respect to a first set of the variable nodes, each variable node in the first set having a column weight that is greater than or equal to a column-weight threshold, and
execute min-sum (MS) decoding with respect to a second set of the variable nodes, each variable node in the second set having a column weight that is less than the column-weight threshold,
wherein the first and second sets of variable nodes are mutually exclusive sets respectively grouped into two sets before decoding begins such that the first set of variable nodes all have a high column weight that is greater than or equal to a column-weight threshold and the second set of variable nodes all have a low column weight that is less than the column-weight threshold, and
wherein, in each decoding iteration, the decoder selectively executes one of the BF decoding and the MS decoding based on determining whether a set of variable nodes associated with decoding belong to the first set of the variable nodes having the high column weight or the second set of the variable nodes having the low column weight.

2. The memory controller of claim 1, wherein the irregular code is an irregular low-density parity-check (LDPC) code.

3. The memory controller of claim 1, wherein results of the BF decoding and the MS decoding are exchanged during decoding.

4. The memory controller of claim 1, wherein the decoder executes BF decoding to update decisions of the variable nodes in the first set.

5. The memory controller of claim 1, wherein the decoder executes MS decoding to update decisions of the variable nodes in the second set.

6. A decoder for decoding received codewords of an irregular code having non-uniform column-weight distribution and representable by at least variable nodes, the decoder comprising:
   a bit-flipping (BF) decoding module configured to execute BF decoding with respect to a first set of the variable nodes, each variable node in the first set having a column weight that is greater than or equal to a column-weight threshold; and
   a min-sum (MS) decoding module configured to execute MS decoding with respect to a second set of the variable nodes, each variable node in the second set having a column weight that is less than the column-weight threshold,
   wherein the first and second sets of variable nodes are mutually exclusive sets respectively grouped into two sets before decoding begins such that the first set of variable nodes all have a high column weight that is greater than or equal to a column-weight threshold and the second set of variable nodes all have a low column weight that is less than the column-weight threshold, and
   wherein, in each decoding iteration, the decoder selectively executes one of the BF decoding and the MS decoding based on determining whether a set of variable nodes associated with decoding belong to the first set of the variable nodes having the high column weight or the second set of the variable nodes having the low column weight.

7. The decoder of claim 6, wherein the BF decoding module is integrated in a BF decoder that is part of the decoder.

8. The decoder of claim 7, wherein the MS decoding module is integrated in an MS decoder that is part of the decoder.

9. The decoder of claim 6, wherein the BF and MS decoding modules each comprises a sub-algorithm embodied in the decoder.

10. The decoder of claim 6, wherein the BF and MS decoding modules exchange results during decoding.

11. A method for decoding received codewords of an irregular code having non-uniform column-weight distribution and representable by variable nodes and check nodes, the method comprising the steps of:
   updating decisions of a first set of the variable nodes, using a bit-flipping (BF) algorithm, to obtain updated decisions of the variable nodes of the first set;
   updating a syndrome vector for the codewords using the updated decisions of the variable nodes of the first set;
   updating messages between the check nodes and a second set of variable nodes, using a min-sum (MS) algorithm, to obtain updated decisions of the variable nodes of the second set; and
   updating the syndrome vector using the update decisions of the variable nodes of the second set,
   wherein the first and second sets of variable nodes are mutually exclusive sets respectively grouped into two sets before decoding begins such that the first set of variable nodes all have a high column weight that is greater than or equal to a column-weight threshold and the second set of variable nodes all have a low column weight that is less than the column-weight threshold, and
   wherein, in each decoding iteration, one of the BF algorithm and the MS algorithm is selectively used for decoding the first set of the variable nodes having the high column weight or the second set of the variable nodes having the low column weight.

12. The method of claim 11, wherein the irregular code is an irregular low-density parity-check (LDPC) code.

13. The method of claim 11, wherein the BF algorithm and the MS algorithm exchange decoding results.

14. The method of claim 11, further comprising:
   determining whether or not all syndrome bits of the syndrome vector are zero, and when it is determined that not all syndrome bits are zero, performing another iteration of decoding up to a maximum number of iterations.

15. The method of claim 11, further comprising:
   calculating the syndrome vector before updating decisions of the first set of the variable nodes.

16. The method of claim 11, wherein the first set of variable nodes having the high column weight are processed with the bit-flipping (BF) algorithm.

* * * * *